(12) United States Patent
Dong et al.

(10) Patent No.: US 6,521,526 B2
(45) Date of Patent: Feb. 18, 2003

(54) METHOD OF MANUFACTURING FLASH MEMORY

(75) Inventors: Cha Deok Dong, Kyungki-Do (KR); Sang Wook Park, Seoul (KR); Se Ho Park, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 09/998,339

(22) Filed: Dec. 3, 2001

(65) Prior Publication Data

US 2002/0068439 A1 Jun. 6, 2002

(30) Foreign Application Priority Data

Dec. 5, 2000 (KR) ........................................ 2000-73258

(51) Int. Cl.$^7$ .......................................... H01L 21/4763
(52) U.S. Cl. ..................................................... 438/637
(58) Field of Search ................................ 438/637, 648, 438/672, 675, 275

(56) References Cited

U.S. PATENT DOCUMENTS

| | | | |
|---|---|---|---|
| 5,607,873 A | * 3/1997 | Chen et al. | 437/51 |
| 5,783,471 A | * 7/1998 | Chu | 438/257 |
| 5,814,862 A | * 9/1998 | Sung et al. | 257/344 |
| 5,973,374 A | * 10/1999 | Longcor | 257/390 |
| 6,051,467 A | * 4/2000 | Chan et al. | 438/264 |
| 6,143,648 A | * 11/2000 | Rodriguez et al. | 438/640 |

* cited by examiner

Primary Examiner—David Nelms
Assistant Examiner—Quoc Hoang
(74) Attorney, Agent, or Firm—Morgan, Lewis & Bockius LLP

(57) ABSTRACT

The present invention forms a protection layer of doped amorphous silicon or amorphous silicon on a semiconductor substrate in which a control gate is formed in a stack structure of doped poly Si and etches only a given portion of the protection layer in a subsequent process to form a contact hole. Therefore, the present invention can prevent oxidization of a given portion of WSix due to exposed WSix.

21 Claims, 3 Drawing Sheets

METHOD OF MANUFACTURING FLASH MEMORY

BACKGROUND OF THE INVENTION

1. Field of the Invention

The invention relates generally to a method of manufacturing a flash memory. More particularly, the invention relates to a method of manufacturing a flash memory capable of preventing oxidization of a given portion of WSix due to exposed WSix, in a way that a protection layer of doped amorphous silicon or amorphous silicon is formed on a semiconductor substrate in which a control gate is formed in a stack structure of doped poly Si and only a given portion of the protection layer is then etched in a subsequent process to form a contact hole.

2. Description of the Prior Art

Recently, a commercial flash device mainly includes a structure in which a control gate is formed in a stack structure of doped poly Si and WSix, an metal line and a contact plug for connecting the control gate and the metal line in order to give a device operating voltage are formed.

Explaining in short a method of manufacturing a flash device, a non-reflection layer and an insulating layer are sequentially deposited on a semiconductor substrate in which a control gate is formed in a stack structure of doped poly Si and WSix. The non-reflection layer and the insulating layer are then patterned by a given etching process to form a contact hole through which Wsix can be exposed. Thereafter, after an anti-diffusion film is formed on the entire structure including the contact hole, the contact hole is filled with tungsten plug. Then, a metal line and a barrier layer are sequentially deposited on the entire structure and are then patterned.

Upon formation of the contact hole, however, a given portion on an upper surface of WSix is exposed to oxygen by a given etching process. Then, the exposed portion of WSix and oxygen react to produce tungsten oxide such as $WO_3$ or WO on an upper surface of WSix. That is, as shown in FIG. 1, upon formation of the contact hole, tungsten oxide is formed between the anti-diffusion film and the WSix layer by means of given etching process.

The thickness of tungsten oxide is increased by means of a subsequent process so that tungsten oxide remains between WSix and the anti-diffusion film. Thus, there is a problem that a contact resistance between WSix ad the anti-diffusion film is increased to reduce the operating speed of the device.

Further, as shown in FIG. 2, in a higher-integrated flash device of 0.18 μm, a seam is generated within WSix, which causes to increase Rs of the control gate. The seam is a result of weaken growth interface of WSix exposed to oxygen during a high temperature oxide film formation process for supplementing a cell side wall since portions where different crystal directions meet by the difference of WSix deposition direction (or crystal growth direction) depending on the morphology after forming WSix. Thus, there is a problem that short of the control gate is caused.

SUMMARY OF THE INVENTION

It is therefore an object of the present invention to provide a method of manufacturing a flash memory capable of preventing exposure of a given portion of a control gate, when a contact hole in which a contact plug will be formed is formed.

Another object of the present invention is to provide a method of manufacturing a flash memory capable of preventing exposure of a given portion of a control gate, in a way that the protection layer of doped amorphous silicon or amorphous silicon is formed on a semiconductor substrate in which a control gate is formed in a stack structure of doped poly Si and only a given portion of the protection layer is then etched in a subsequent process to form a contact hole.

In order to accomplish the above object, a method of manufacturing a flash memory according to the present invention, is characterized in that it comprises the steps of forming a control gate on semiconductor substrate in which given structures are formed; forming a protection layer on the control gate; forming a non-reflection layer on the protection layer; forming an insulating layer on the non-reflection layer; forming a contact hole to expose a given portion of the protection layer; forming a first metal protection film on the entire structure including the contact hole; forming a contact plug to fill the contact hole; forming a second metal protection film on the contact plug; and forming a metal line on the entire structure including an ohmic contact layer.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
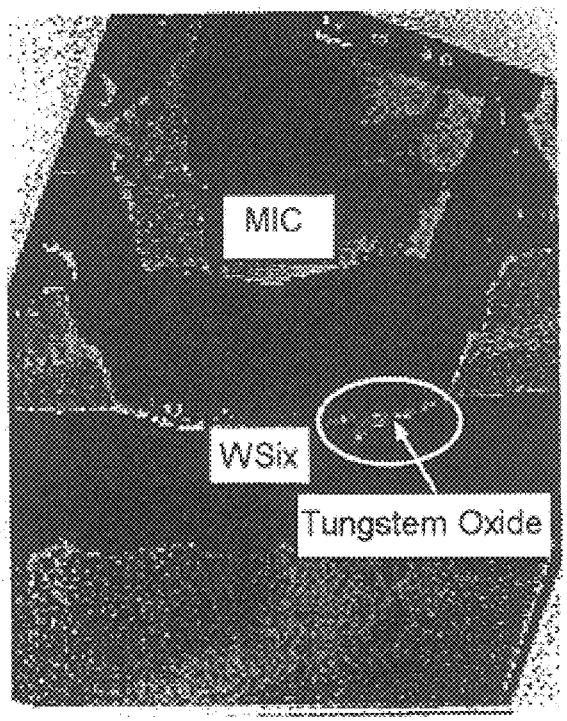
FIG. 1 is a TEM photography taken the cross-sectional view of a conventional flash memory.
Figure 2:
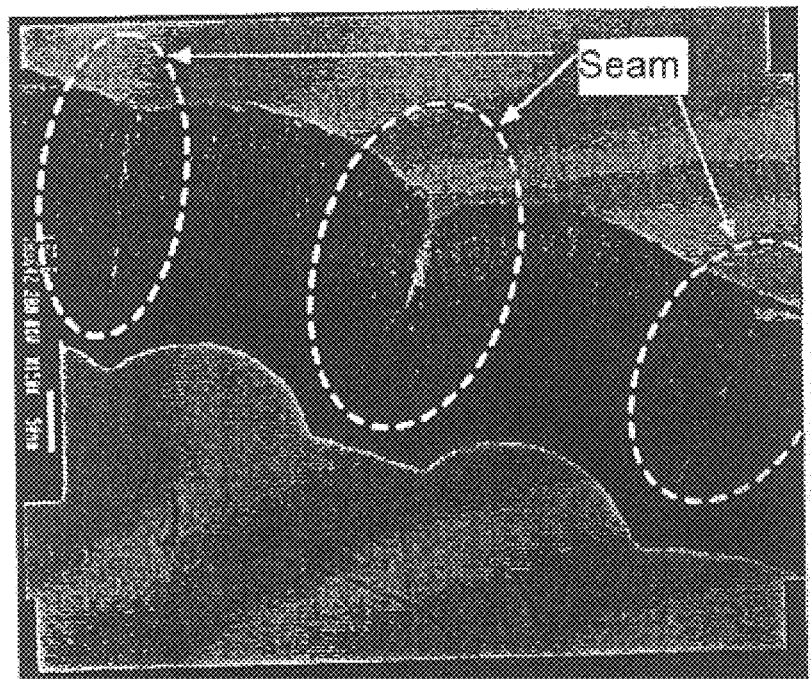
FIG. 2 is a TEM photography taken a seam formed in WSix.

The present invention will be described in detail by way of a preferred embodiment with reference to accompanying drawings, in which like reference numerals are used to identify the same or similar parts.

Figure 3A:
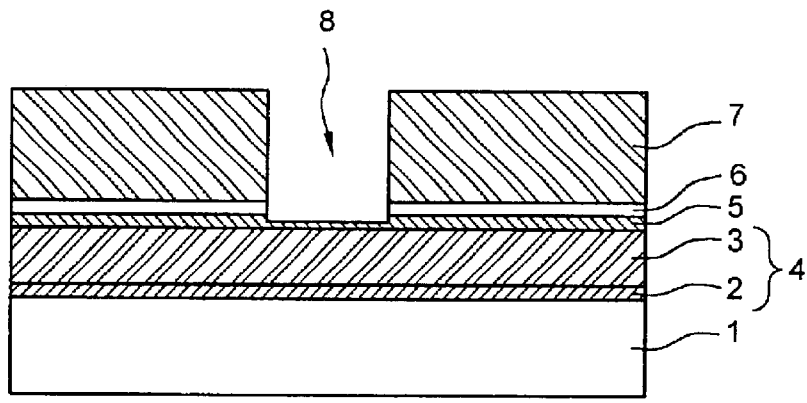
FIGS. 3A through 3C are cross-sectional views of a flash memory sequentially shown to explain a method of manufacturing the flash memory according to one embodiment of the present invention.
Figure 3B:
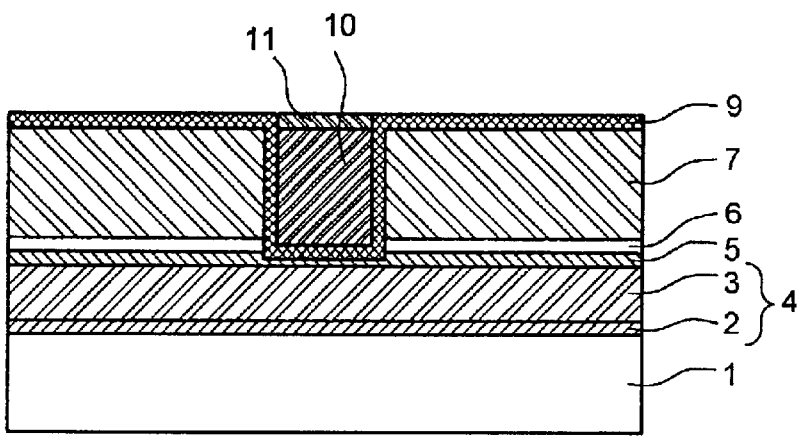
Figure 3C:
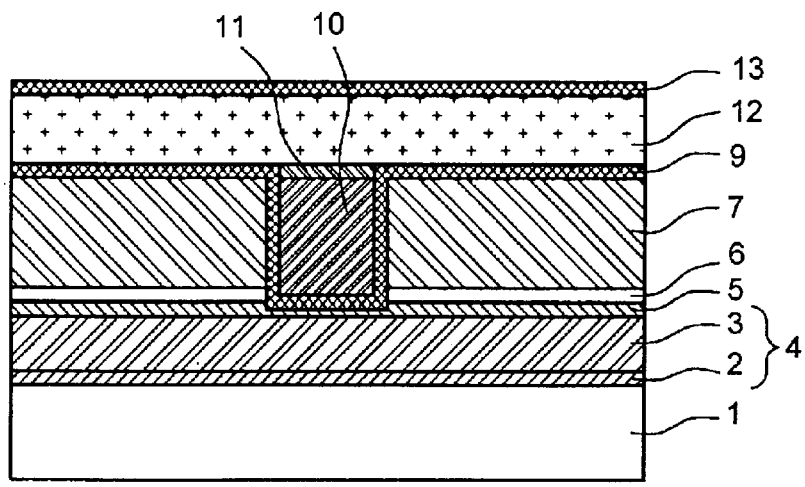

FIGS. 3A through 3C are cross-sectional views of a flash memory sequentially shown to explain a method of manufacturing the flash memory according to one embodiment of the present invention.

Referring now to FIG. 3A, a tunnel oxide film and a floating gate are deposited on a given portion of a semiconductor substrate 1 and are then patterned.

The semiconductor substrate 1 is cleaned by a cleaning solution in which the first mixture solution of HF and $H_2O$ mixed at the ratio of 50:1 or 100:1 and the second mixture solution of $NH_4OH$, $H_2O_2$ and $H_2O$ mixed in a given ratio are mixed in a given ratio.

The tunnel oxide film is formed by performing wet oxidization at the temperature of 750~800° C. and then performing a thermal process at the temperature of 900~910° C. under $N_2$ gas atmosphere for 20~30 minutes.

The floating gate is formed in thickness of 500~1500 Å at the temperature of 550~620° C. under the pressure of 0.1~3 Torr under Si gases such as $SiH_4$ or $Si_2H_6$ and $PH_3$ gas atmosphere.

Thereafter, the entire top structure including the floating gate is cleaned by a cleaning solution in which a first mixture solution of HF and $H_2O$ mixed at the ratio of 50:1 or 100:1 and a second mixture solution of $NH_4OH$, $H_2O_2$ and $H_2O$ mixed in a given ratio are mixed in a given ratio.

Then, a first dielectric film (not shown) of a hot temperature oxide (HTO) is formed on the entire structure using $SiH_2Cl_2$ and $N_2O$ gas as a source having a good time dependent dielectric breakdown characteristic (TDDB) at the temperature of 810~850° C. under the pressure of 0.1~0.5 Torr.

Next, a second dielectric film (not shown) is formed on the first dielectric film under gas atmosphere in which $NH_3$ and $SiH_2Cl_2$ are mixed in a given ratio. At the same time, a third dielectric film (not shown) of a hit temperature oxide (HTO) is formed at the temperature of 810~850° C. under the pressure of 0.1~0.5 Torr using $SiH_2Cl_2$ and $N_2O$ gas having a good TDDB characteristic as a source.

Thereafter, the entire top structure is experienced by a thermal process using vapor at the temperature of 750~790° C. by wet oxidization method in order to improve the characteristic of each of the dielectric films and enhance an interface characteristic.

Then, a silicon layer 2 is formed on the entire structure. The silicon layer 2 is formed in thickness of 500~1000 Å at the ratio of amorphous silicon and amorphous silicon of 5:1~7:1 by depositing doped amorphous silicon at the temperature of 510~550° C. under the pressure of 0.1~1 Torr under Si gas such as $SiH_4$ or $Si_2H_6$ and $PH_3$ gas atmosphere and then depositing amorphous silicon only under Si gas atmosphere.

Next, the entire top structure including the silicon layer 2 is cleaned by a cleaning solution in which the first mixture solution of HF and $H_2O$ mixed in a given ratio and the second mixture solution of $NH_4F$ and HF mixed in a given ratio are mixed in a given ratio.

Thereafter, Wsix 3 is formed on the entire structure including the silicon layer 2. Wsix 3 is formed in thickness of 500~2000 Å at the stoichiometry of 2.0~2.8 capable of implementing an adequate step coverage and minimizing Rs using reaction of low F, low post annealed stress and good adhesive strength $SiH_2Cl_2$ and $WF_6$ at the temperature of 300~600° C.

Then, doped amorphous silicon or amorphous silicon is in-situ deposited on the entire top structure including Wsix 3 in the same deposition or is ex-situ deposited in a different deposition equipment including a preprocessing cleaning process, thus forming a protection layer 5.

In case that the doped amorphous silicon is deposited in-situ, the protection layer 5 is formed in thickness of 200~500 Å at the temperature of 550~650° C. under the pressure of 1~3 Torr under a gas atmosphere in which $Si_2H_6$ and $PH_3$ are mixed at the ratio of 1.0:1.5~1.5:2.0 or in which $SiH_4$ and $PH_3$ are mixed at the ratio of 1.0:1.5~1.5:2.0.

On the other hand, in case that doped amorphous silicon or amorphous silicon is deposited ex-situ, WSix 3 is deposited by a preprocessing process and is then experienced by a cleaning process using a cleaning solution in which $H_2SO_4$ and $H_2O_2$ are mixed in a given ratio, a cleaning solution in which $NH_4OH$, $H_2O_2$ and $H_2O$ are mixed in a given ratio and a cleaning solution in which HF and $H_2O$ are mixed in a given ratio or a cleaning solution in which $NH_4F$ and HF are mixed in a given ratio in order to remove particles or a native oxide film existing on its upper surface.

In case that amorphous silicon is deposited ex-situ, the protection layer 5 is formed in thickness of 200~500 Å with Si source gas of 100~2000 sccm implanted and $PH_3$ of 50~200 sccm implanted at the temperature of 460~550° C. under the pressure of 0.1~3 Torr under a gas atmosphere in which $Si_2H_6$ and $PH_3$ are mixed in a given ratio or $SiH_4$ and $PH_3$ are in a given ratio.

Thereafter, the entire top structure including the protection layer 5 is cleaned by a cleaning solution in which $H_2SO_4$ and $H_2O_2$ are mixed in a given ratio.

Then, a non-reflection layer 6 is formed in thickness of 300~1500 Å on the entire top structure using $SiH_4$, $N_2O$, $N_2$ or He. In addition, a $SiO_xN_y$ thin film having a low reflectivity and an adequate refractive index may be formed in thickness of 300~1500 Å on the non-reflection layer 6.

Next, a thin insulating layer 7 formed of a thin film of a series of an oxide film using TEOS or DCS or an oxide film using PSG, BPSG or SOG is formed on the entire structure including the non-reflection layer 6.

Then, the insulating layer 7 and the non-reflection layer 6 are etched to expose a given portion of the protection layer 5 by means of a given etching process, thus forming a contact hole 8.

Thereafter, the entire top structure including the contact hole 8 is cleaned by a cleaning solution in which HF and $H_2O$ are mixed in a given ratio or in which $NH_4F$ and HF are mixed in a given ratio.

Referring now to FIG. 3B, a first metal protection film 9 having a stack structure of Ti and TiN is formed on the entire structure.

Then, W is deposited to fill the contact hole 8 and is then patterned to form a contact plug 10. At the same time, a second metal protection film 11 having a stack structure of Ti and TiN is formed on the contact plug 10.

Referring now to FIG. 3C, a metal line 12 of Al and a third metal protection film 13 having a stack structure of Ti and TiN are sequentially formed on the entire structure including an ohmic contact layer 11.

As mentioned above, the present invention sequentially deposits a protection layer of doped amorphous silicon or amorphous silicon, a non-reflection layer and an insulating layer on a given portion of a semiconductor substrate in which a control gate is formed in a stack structure of doped poly Si and WSix.

The insulating layer and the non-reflection layer are then patterned by a given etching process so that the protection layer can be exposed, thus forming a contact hole. Next, after forming a first metal protection film on the entire structure including the contact hole, a contact plug and a second metal protection film are sequentially formed to fill contact hole. Thereafter, a metal line and a third metal protection film are sequentially deposited on the entire structure and are then patterned.

Figure 4:
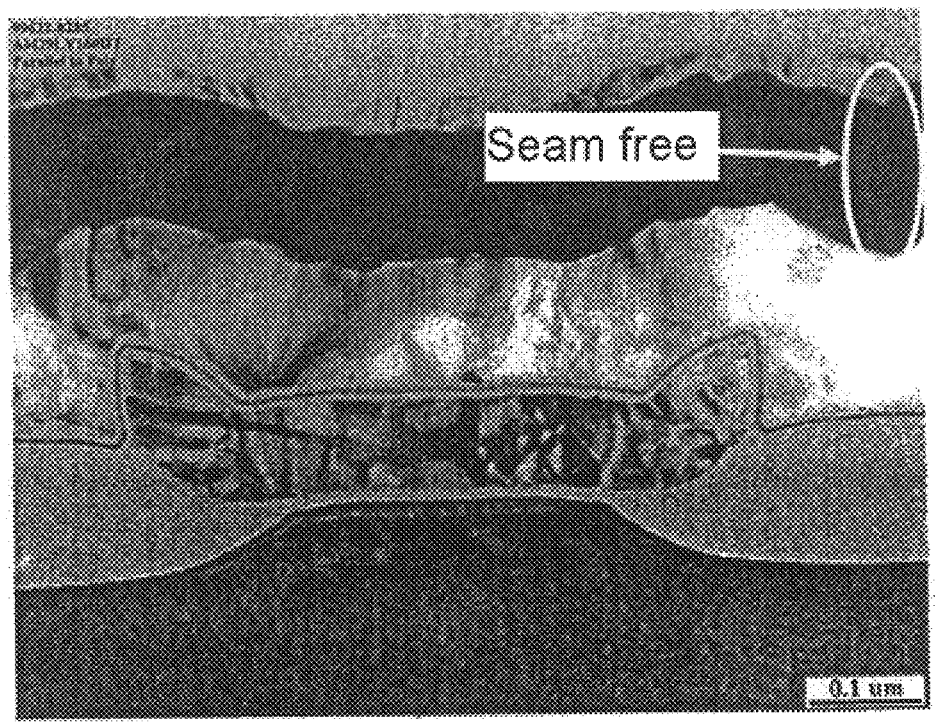
FIG. 4 is a TEM photography taken the cross-sectional view of a conventional flash memory according to one embodiment of the present invention.

That is, after forming the protection layer on WSix, only a given portion of the protection layer is etched. Thus exposure of WSix can be prevented and oxidization of an upper surface of the protection layer can be thus prevented. Therefore, as shown in FIG. 4, a seam generated within WSix can be prevented to thus form WSix of a constant shape.

As can be understood from the above description, the present invention can prevent oxidization of a given portion of WSix due to exposed WSix by forming a protection layer of doped amorphous silicon or amorphous silicon on a semiconductor substrate in which a control gate is formed in a stack structure of doped poly Si and WSix and only a given portion of the protection layer is then etched in a subsequent process to form a contact hole.

Therefore, an interface characteristic of the contact plug formed in a subsequent process and WSix is improved to reduce a contact resistance and to simultaneously prevent a seam of the interior of WSix.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed are:

1. A method of manufacturing a flash memory, comprising the steps of:

forming a control gate on a semiconductor substrate;

forming a protection layer on the control gate;

forming a non-reflecting layer on the protection layer;

forming an insulating layer on the non-reflecting layer;

forming a contact hole through the insulating layer and non-reflecting layer to expose a portion of the protection layer without exposing the control gate;

forming a first metal protection film on the semiconductor substrate and the contact hole;

forming a contact plug to fill the contact hole;

forming a second metal protection film on the contact plug; and forming a metal line on the first and second metal protection films.

2. The method according to claim 1, further including the steps of cleaning the semiconductor substrate using a cleaning solution in which a first mixture solution of HF and $H_2O$ mixed at a first ratio of one of 50:1 and 100:1, and a second mixture solution of $NH_4OH$, $H_2O_2$ and $H_2O$ mixed in a second ratio, prior to forming a tunnel oxide film, a floating gate, and a dielectric layer.

3. The method according to claim 2, wherein the tunnel oxide film is formed by wet oxidization at a temperature of 750–800° C. and a thermal process at a temperature of 900–910° C. in an $N_2$ gas atmosphere for 20–30 minutes.

4. The method according to claim 2, wherein a thickness of the floating gate is 500–1500 Å and is formed at a temperature of 550–620° C. under a pressure of 0.1–3 Torr in Si gases including one of a $SiH_4$ gas and a $Si_2H_6$ gas, and a $PH_3$ gas atmosphere.

5. The method according to claim 2, wherein after forming the floating gate, the dielectric layer is cleaned using the first mixture solution and the second mixture solution.

6. The method according to claim 5, wherein the dielectric layer includes a stacked structure of a first dielectric film formed at a temperature of 810–850° C. under a pressure of 0.1–0.5 Torr in a $SiH_2Cl_2$ gas and a $N_2O$ gas atmosphere, a second dielectric film formed on the first dielectric film in a gas atmosphere in which a $NH_3$ gas and a $SiH_2Cl_2$ gas are mixed in a first ratio, and a third dielectric film formed on the second dielectric film at a temperature of 810–850° C. under a pressure of 0.1–0.5 Torr in a $SiH_2Cl_2$ gas and a $N_2O$ gas atmosphere.

7. The method according to claim 1, wherein the semiconductor substrate is thermally processed using a vapor at a temperature of 750–790° C. by a wet oxidization method.

8. The method according to claim 1, wherein the control gate includes a stacked structure of a silicon layer and $WSi_x$.

9. The method according to claim 8, wherein a thickness of the silicon layer is 500–1000 Å and includes at least a first amorphous silicon layer and a second amorphous silicon layer, wherein a ratio of a thickness of the first amorphous silicon layer to a thickness of the second amorphous silicon layer is 5:1–7:1, and the first amorphous silicon layer is formed by depositing doped amorphous silicon at a temperature of 510–550° C. under a pressure of 0.1–1 Torr in Si gases including one of a $SiH_4$ gas and a $Si_2H_6$ gas, and a $PH_3$ gas atmosphere, and the second amorphous silicon layer is formed by depositing amorphous silicon only under a Si gas atmosphere.

10. The method according to claim 8, wherein a thickness of the $WSi_x$ is 500–2000 Å at a stoichiometric proportion of 2.0–2.8, and is formed by cleaning the semiconductor substrate in which a first cleaning solution including HF and $H_2O$ are mixed in a first ratio, a second cleaning solution including $NH_4F$ and HF are mixed in a second ratio, and processing the semiconductor substrate using a reaction of $SiH_2Cl_2$ and $WF_6$ at a temperature of 300–600° C.

11. The method according to claim 1, wherein the step of forming a protection layer includes one of a deposited in-situ doped amorphous silicon and a deposited ex-situ doped amorphous silicon and amorphous silicon.

12. The method according to claim 11, wherein the protection layer includes in-situ doped amorphous silicon formed to a thickness of 200–500 Å and is formed at a temperature of 550–650° C. under a pressure of 0.1–3 Torr in a gas atmosphere in which one of a $Si_2H_6$ gas and a $PH_3$ gas are mixed at a ratio of 1.0:1.5–1.5:2.0 and a $SiH_4$ gas and a $PH_3$ gas are mixed at a ratio of 1.0:1.5–1.5:2.0.

13. The method according to claim 11, wherein the deposited ex-situ doped amorphous silicon and amorphous silicon are cleaned using one of a cleaning solution in which $H_2SO_4$ and $H_2O_2$ are mixed in a first ratio, a cleaning solution in which $NH_4OH$, $H_2O_2$ and $H_2O$ are mixed in a second ratio, a cleaning solution in which one of HF and $H_2O$ are mixed in a third ratio, and a cleaning solution in which $NH_4F$ and HF are mixed in a fourth ratio.

14. The method according to claim 11, wherein the protection layer includes ex-situ amorphous silicon formed to a thickness of 200–500 Å and is formed with a Si source gas of 100–2000 sccm and a $PH_3$ gas of 50–200 sccm at a temperature of 460–550° C. under a pressure of 0.1–3 Torr in a gas atmosphere in which one of a $Si_2H_6$ gas and a $PH_3$ gas are mixed in a first ratio and a $SiH_4$ gas and a $PH_3$ gas are mixed in a second ratio.

15. The method according to claim 1, wherein a thickness of the non-reflecting layer is 300–1500 Å and the protection layer is cleaned with a cleaning solution in which $H_2SO_4$ and $H_2O_2$ are mixed in a first ratio by at least one of $SiH_4$, $N_2O$, $N_2$, and He.

16. The method according to claim 15, further including the step of forming a $SiO_xN_y$ film on the non-reflecting layer to a thickness of 300–1500 Å.

17. The method according to claim 1, wherein the insulating layer is formed of one of an oxide film using one of TEOS and DCS and an oxide film using one of PSG, BPSG, and SOG.

18. The method according to claim 1, wherein the first metal protection film is cleaned using one of a first cleaning solution in which HF and $H_2O$ are mixed in a first ratio and a second cleaning solution in which $NH_4F$ and HF are mixed in a second ratio, and is formed in a stacked structure including Ti and TiN.

19. The method according to claim 1, wherein the contact plug includes W.

20. The method according to claim 1, wherein the metal line includes Al.

21. The method according to claim 1, wherein a third metal protection film of a stacked structure including Ti and TiN is formed on the metal line.

* * * * *